United States Patent
Beuschel

(10) Patent No.: US 11,984,908 B2
(45) Date of Patent: May 14, 2024

(54) ANALOGUE-TO-DIGITAL CONVERTER

(71) Applicant: Microvision, Inc., Redmond, WA (US)

(72) Inventor: Ralf Beuschel, Wangen (DE)

(73) Assignee: Microvision, Inc., Redmond, WA (US)

( * ) Notice: Subject to any disclaimer, the term of this patent is extended or adjusted under 35 U.S.C. 154(b) by 385 days.

(21) Appl. No.: 17/298,449

(22) PCT Filed: Nov. 27, 2019

(86) PCT No.: PCT/EP2019/082728
§ 371 (c)(1),
(2) Date: May 28, 2021

(87) PCT Pub. No.: WO2020/109378
PCT Pub. Date: Jun. 4, 2020

(65) Prior Publication Data
US 2022/0029633 A1 Jan. 27, 2022

(30) Foreign Application Priority Data
Nov. 30, 2018 (DE) ...................... 10 2018 220 688.0

(51) Int. Cl.
*H03M 1/50* (2006.01)
*G01S 7/484* (2006.01)
(Continued)

(52) U.S. Cl.
CPC ............... *H03M 1/56* (2013.01); *G01S 7/484* (2013.01); *G01S 7/4866* (2013.01); *G01S 17/931* (2020.01)

(58) Field of Classification Search
CPC ....... H03M 1/56; H03M 1/0836; G01S 7/484; G01S 7/4866; G01S 17/931
(Continued)

(56) References Cited

U.S. PATENT DOCUMENTS 7,109,475 B1 * 9/2006 Hardman ................ H01J 49/40
250/281
8,338,858 B1 * 12/2012 Bastiaans ........... G01N 21/7703
356/73
(Continued)

FOREIGN PATENT DOCUMENTS

EP 2469301 A1 6/2012
JP 2010-91377 4/2010
(Continued)

OTHER PUBLICATIONS

Wahl, Michael, The Principle of Time-Correlated Single Photon Counting, PicoQuant Technical Note, p. 1-14 (Jun. 24, 2014).
(Continued)

*Primary Examiner* — Jean B Jeanglaude
(74) *Attorney, Agent, or Firm* — Kevin D. Wills

(57) ABSTRACT

Described herein are analog-to-digital converters (ADCs) that utilize time-to-digital converters (TDCs) and a histogram block to generate time-correlated histograms from analog signals. In some implementations, the time-to-digital converters determine time intervals for which the analog signal above or below a ramp signal, and the histogram block generates the time-correlated histograms of values using the determined time intervals. Furthermore, in some implementations, the analog-to-digital converters receive the analog signals from photodiodes, such as photo diodes used in Light Detection and Ranging (LIDAR) devices. In some such applications, the use of time intervals to generate time-correlated histograms may be used to reduce the effects of time jitter.

20 Claims, 3 Drawing Sheets

(51) Int. Cl.
  *G01S 7/4865* (2020.01)
  *H03M 1/56* (2006.01)
  *G01S 17/931* (2020.01)

(58) Field of Classification Search
  USPC ........................................................ 341/166
  See application file for complete search history.

(56) References Cited

U.S. PATENT DOCUMENTS

| | | |
|---|---|---|
| 8,947,659 B1 | 2/2015 | Baastians et al. |
| 2011/0049355 A1 | 3/2011 | Fuhrer et al. |
| 2018/0328845 A1* | 11/2018 | Safai .................... G01B 11/026 |

FOREIGN PATENT DOCUMENTS

| | | |
|---|---|---|
| JP | 2010-91377 A | 4/2010 |
| JP | 2010-258817 | 11/2010 |
| JP | 2010-258817 A | 11/2010 |
| JP | 2013-172296 | 9/2013 |
| JP | 2013-172296 A | 9/2013 |
| JP | 2015-215345 | 12/2015 |
| JP | 2015-215345 A | 12/2015 |
| JP | 2016-176750 | 10/2016 |
| JP | 2016-176750 A | 10/2016 |

OTHER PUBLICATIONS

Kalisz, Józef, Review of methods for time interval measurements with picosecond resolution, Metrologia, Institute of Physics Publishing, vol. 41, p. 17-32 (2004).

Perenzoni, Matteo et al., A 64×64-Pixels Digital Silicon Photomultiplier Direct TOF Sensor With 100-MPhotons/s/ pixel Background Rejection and Imaging/Altimeter Mode With 0.14% Precision Up To 6 km for Spacecraft Navigation and Landing, IEEE Journal of Solid-State Circuits, p. 1-11 (2016).

English translation of International Search Report for PCT/EP2019/082728, Jun. 6, 2020.

Search report for German priority app. No. DE102018220688, May 15, 2019 (relevance of cited references indicated on p. 2).

* cited by examiner

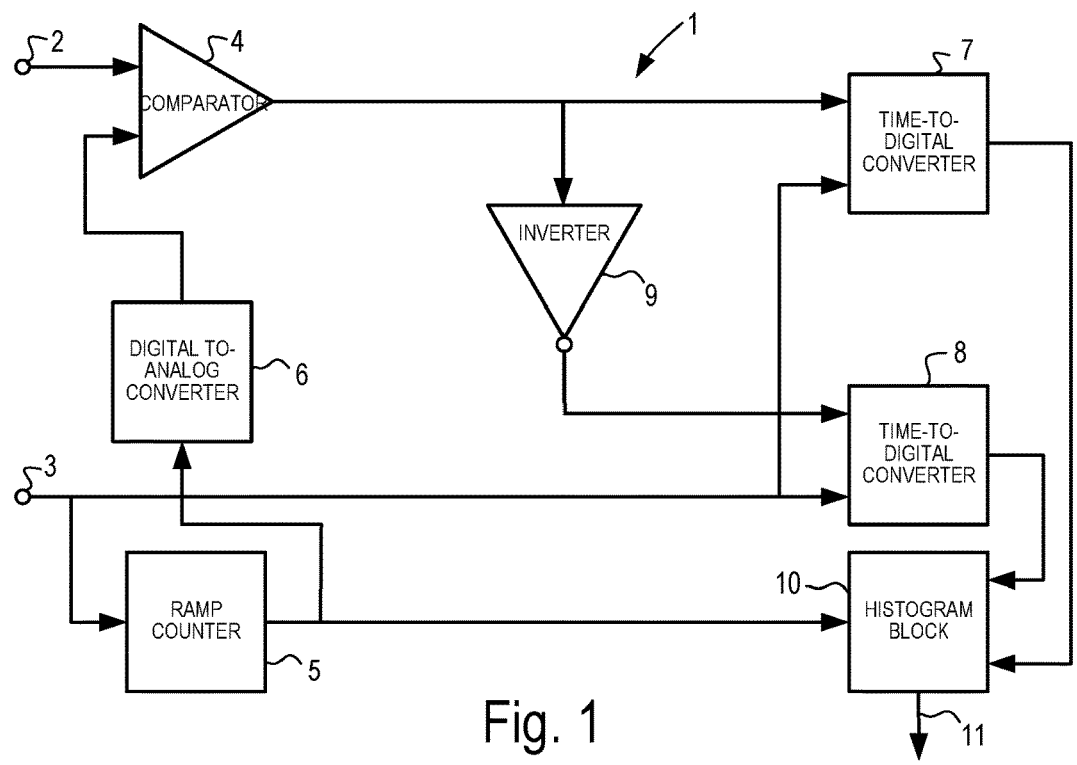
Fig. 1
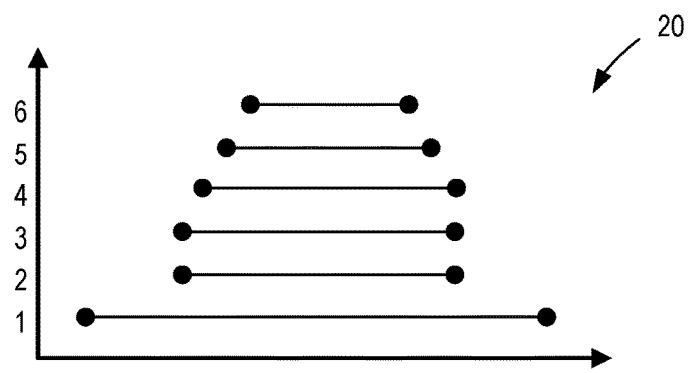
Fig. 2
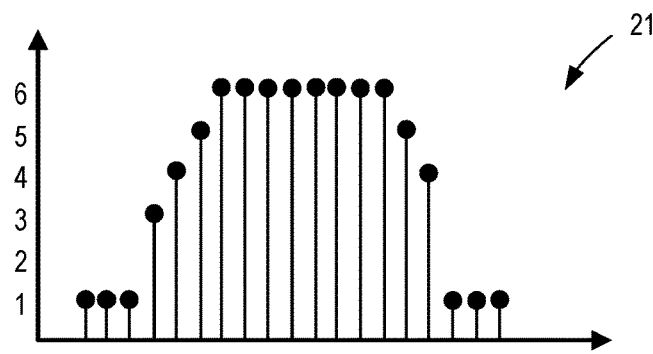

ANALOGUE-TO-DIGITAL CONVERTER

FIELD

The present invention relates generally to an analog-to-digital converter.

BACKGROUND

Various methods for the optical time-of-flight measurement are well known, which can be based on the so-called time-of-flight principle, in the case of which the time-of-flight of a light signal, which is emitted and reflected by an object, is measured in order to determine the distance to the object on the basis of the time-of-flight.

Sensors, which are based on the so-called LIDAR principle (Light Detection and Ranging) are used in particular in the motor vehicle field, in the case of which pulses are periodically emitted for scanning the surrounding area, and the reflected pulses are detected. A corresponding method and a device are known, for example, from WO 2017/081294.

In the case of time-of-flight measurements, in particular in the case of LIDAR measurements, it is required to monitor different analog signals and to scan them at a high scanning rate. For example, the analog signals, which are transmitted by a photodiode for light measurements, are to be scanned, or the current and/or voltage signals of a laser or of a laser diode, respectively, for the monitoring.

Even if solutions for the scanning of analog signals are known from the prior art, it is an object of the present invention to provide an analog-to-digital converter.

BRIEF SUMMARY OF THE INVENTION

The analog-to-digital converter according to claim 1 solves this object.

According to a first aspect, the present invention provides an analog-to-digital converter, comprising: an analog input for receiving an analog signal; a first time-to-digital converter; and a histogram block, wherein the first time-to-digital converter scans the analog signal based on a ramp signal, and delivers an output to the histogram block, which, based thereon, generates a time-correlated histogram.

Further advantageous designs of the invention follow from the subclaims, the drawings, and the following description of preferred exemplary embodiments of the present invention.

As mentioned, some exemplary embodiments relate to an analog-to-digital converter (hereinafter AD converter), comprising: an analog input for receiving an analog signal; a first time-to-digital converter; and a histogram block, wherein the first time-to-digital converter scans the analog signal based on a ramp signal, and delivers an output to the histogram block, which, based thereon, generates a time-correlated histogram.

As mentioned above, it is required in particular in the case of LIDAR measurements to monitor different analog signals and to scan them at a high scanning rate. For example, the analog signals, which are transmitted by a photodiode for light measurements, are to be scanned, or the current and/or voltage signals of a laser or of a laser diode, respectively, for the monitoring, and in the case of some exemplary embodiments, the AD converter is therefore used for the AD conversion of analog signals of a photodiode or of the voltage or current by a laser (diode) or the like, and it can be provided in a corresponding device, e.g. a device for LIDAR measurements or the like, which is used, for example, in the motor vehicle field, without the present invention being limited to these cases. Some exemplary embodiments therefore also relate to a device comprising a detector or sensor, for example based on the SPAD (Single Avalanche Photo Diode) technology, CAPO (Current Assisted Photo Diode) technology, CMOS (Complementary Metal Oxide Semiconductor) technology, or the like, for detecting light pulses, which are emitted by a light source (e.g. laser), and which are reflected by an object, wherein the AD converter of the invention can be used in such a device. Such a device can therefore further be configured to determine the time-of-flight of the emitted light pulses, and, based thereon, to determine, for example, the distance between the means and the object, a three-dimensional image of the object, or the like. In the case of some exemplary embodiments, the determination of the distance is based on the so-called TCSPC (time correlated signal photon counting) measuring principle, in particular in the case of exemplary embodiments, which are based on LIDAR. The described means, devices, or AD converters, respectively, can also be used in an autonomously operated (motor) vehicle.

Laser current pulses, in particular in the case of LIDAR measurements, can be in the range of between two and ten nanoseconds, and AD converters with a frequency of 1 GHz to 5 GHz would thus be required traditionally, wherein AD converters of this type are typically expensive and have a high consumption (for example >500 mW).

In contrast, fast time-to-digital converters are generally known and can have, for example, a time resolution of better than 500 picoseconds, and the first time-to-digital converter (also referred to as "TDC") can therefore be based on a TDC of this type, which is known per se. In the case of some exemplary embodiments, analog signals, such as the current signal or voltage signal, can thus be digitized by a light source in a cost-efficient manner and with a high time resolution.

The first TDC delivers a corresponding output based on the analog signal, wherein the output typically includes time-correlated, digital values, which characterize the analog signal, in that it uses the ramp signal as the basis for the scanning.

The histogram block generates a time-correlated histogram, the bins of which refer to a start time and thus represent the time lag to the start time, wherein the corresponding values of the output of the first TDC are filled into each bin.

In the case of some exemplary embodiments, the amplitude of a periodic input signal (analog signal) can therefore be compared to the ramp signal, and the form of the periodic input signal can be scanned sequentially in several scanning cycles.

In the case of some exemplary embodiments, the histogram block is configured to correct the time-correlated histogram, in order to reduce the effect of a time jittering. The time jittering can result in that values in the output of the first TDC are correlated with "wrong" (e.g. too early or too late in terms of time). The histogram block can at least partially correct such time shifts and/or associated values, which are too high or too low, in the time-correlated histogram, wherein the correcting does not necessarily mean a complete correction here in the sense that the effects of a time jittering can be compensated completely, but it also comprises a partial correction, in the case of which, for example, the effects of a time jittering are at least partially lessened.

In the case of some exemplary embodiments, the effect of the time jittering leads to time-shifted values in the output of the first time-to-digital converter, and such effects can be at least partially lessened.

In the case of some exemplary embodiments, the histogram block combines values from different outputs. The first TDC delivers, for example, sequential outputs, and the histogram block can combine values from such different, consecutive outputs.

For example, the values can be combined such that the maximum value of an output is filled into the time-correlated histogram. If, for example, a second output for the same bin of the time-correlated histogram includes a higher value than the already available value, which originates from a first output, the available value is replaced by the higher value of the second output.

However, the values can thereby also be combined such that an average value is filled into the time-correlated histogram, thus, for example, the average from a value of a previous output, and the value of a current output for a certain bin of the time-correlated histogram.

In the case of some exemplary embodiments, the values are combined on the basis of a function, wherein the function can be non-linear, which can generally lead to a finer or more finely tuned, respectively, or adapted correction of time jitter effects in the case of some exemplary embodiments. The function can also depend on the difference of the values, so that a stronger correction takes place, for example, in the case of larger differences between different outputs.

In the case of some exemplary embodiments, the values in the time-correlated histogram are shifted by at least one time instance. Shifts of scanning values caused by time jittering canthus be (at least partially) compensated.

In the case of some exemplary embodiments, the AD converter further comprises a start signal input for receiving a periodic start signal. The periodic start signal can be generated, for example, by a pulse generator, and can be delivered to the AD converter. The periodic start signal can also be delivered to the (first) TDC and/or to the histogram block, wherein they then likewise use the start signal to start a measuring cycle.

In the case of some exemplary embodiments, the AD converter further comprises a ramp generator, which generates the ramp signal. The ramp generator has, for example, a ramp counter, which generates a counter value based on the periodic start signal. In the case of some exemplary embodiments, the AD converter (or the ramp generator, respectively) further comprises a digital-to-analog converter, which generates the ramp signal based on the counter value.

In the case of some exemplary embodiments, the analog-to-digital counter further comprises a comparator, which compares the ramp signal and the analog signal, and outputs a comparator signal to the first time-to-digital converter.

In the case of some exemplary embodiments, the analog-to-digital converter further comprises a second time-to-digital converter, wherein the first time-to-digital converter captures time intervals, at which the analog signal is above the ramp signal, and the second time-to-digital converter captures time intervals, at which the analog signal is below the ramp signal. The corresponding outputs of the first and second TDC are delivered to the histogram block, which, based thereon, then generates the time-correlated histogram, which can then be further evaluated, wherein the histogram block outputs, for example, a waveform, which it generates based on the time-correlated histogram, in that it adapts, for example, a Gaussian function, a sine function, or the like, to the course of the time-correlated histogram.

The method steps described above or herein, respectively, can also be the subject matter of a method for operating an AD converter, in particular as it is disclosed herein.

Some exemplary embodiments also relate to a (computer) program, which receives instructions, which, when they are run on a processor or computer, result in that the method described herein is carried out.

Some exemplary embodiments also relate to a computer-readable medium, which receives a program or instructions, respectively, which, when run on a processor or computer, result in that the program or method described herein, respectively, is carried out.

BRIEF DESCRIPTION OF THE DRAWINGS

Exemplary embodiments of the invention will now be described in an exemplary manner and with reference to the enclosed drawing, in which:

FIG. 1 shows a circuit diagram of an exemplary embodiment of an analog-to-digital converter; and FIG. 2 shows an output of a TDC and a TC histogram;

DESCRIPTION OF EMBODIMENTS

Figure 3:
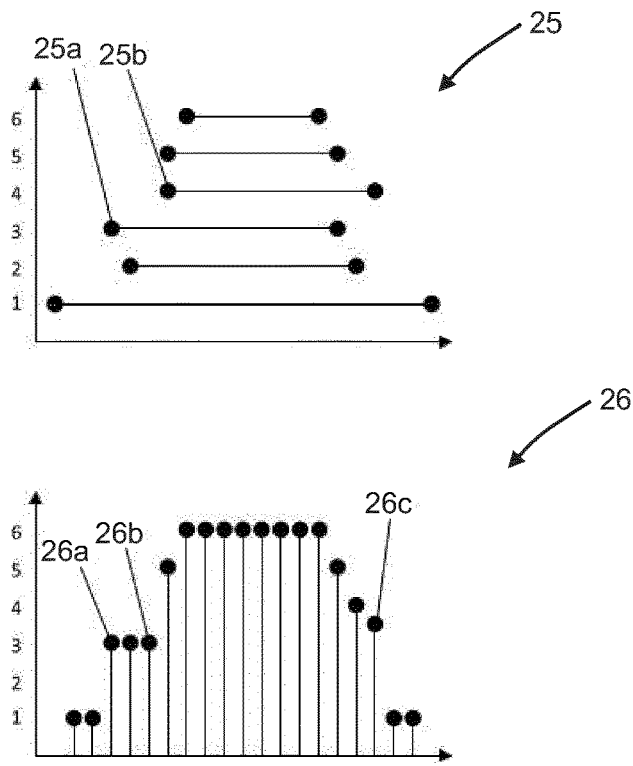
FIG. 3 shows an output of a TDC and a TC histogram under the influence of time jittering.

FIG. 1 shows a circuit diagram of an exemplary embodiment of an analog-to-digital converter 1, hereinafter referred to as AD converter 1 in short.

As also described above, the AD converter 1 can generally be used in the case of all signals, which are periodic and which repeat at least twice, without being changed.

Without limiting the invention thereto, it is assumed in the present exemplary embodiments that the AD converter 1 is used in a LIDAR measuring system, which uses the TCSP measuring principle. The used laser pulse or the laser pulse sequence can thereby be emitted periodically and at a high frequency, e.g. every two microseconds for a 300 meter range.

The general mode of operation of the AD converter is based on that a periodic input signal is compared to a ramp signal.

The ramp signal is relatively slow and can be synchronous or asynchronous with the periodic input signal cycle. TDCs (Time-to-Digital Converter) measure the points in time, at which the ramp signals is crossed for each period, and the measurements are written into a time-correlated histogram block, as will also be described in more detail below:

The AD converter 1 has an analog input 2, at which the analog signal to be converted is input, and it has a start signal input 3, to which a periodic start signal or pulse signal, respectively, is applied, which originates, for example, from a pulse generator and which is also used for the generation of light pulses for the LIDAR measuring system.

The AD converter 1 further has a comparator 4 for comparing the analog signal, which is received at the analog input 2, to an analog ramp signal.

In this exemplary embodiment, the analog ramp signal has the shape of a rising sawtooth, starts at approximately zero volt, and rises up to a specified maximum value. The rise duration of the ramp signal is based here on a fixed multiple of the pulse generator frequency and is, for example, tramp=⅟₁₂₈*fpulse, in order to scan with an effective resolution of 7 bits, wherein "tramp" is the frequency of the ramp signal, and "fpulse" is the frequency of the pulse signal, which is received via the start signal input 3.

The ramp signal is generated via a ramp counter 5, which is coupled to a digital-to-analog converter 6 (hereinafter referred to as DA converter).

The ramp counter 5 increases its counter by one with each received start pulse (that is, at the start of a new scanning cycle), which is received via the start signal input 3. The received binary value is delivered to the DA converter 6, which generates a corresponding ramp signal from the binary value, which thus also has a higher ramp voltage or a higher ramp threshold value, respectively, with increasing binary value.

On the one hand, the output of the comparator 4 is coupled (directly) to a first TDC 7 and, on the other hand, (indirectly) to a second TDC 8, wherein the comparator signal first runs through an inverter 9, which inverts the comparator signal and then delivers it to the second TDC 8.

The start pulse is likewise delivered from the start signal input 3 to the first TDC 7 and to the second TDC 8, so that the "start" of the signal pulse starts a measuring cycle.

The first TDC 7 measures the time instances (or time intervals), when the analog input signal originating from the analog input 2 rises beyond the ramp signal, thus crosses the latter to the top, with respect to the start signal, which is received from the start signal input 3.

The second TDC 8 receives the inverted comparator signal and measures the time instances (or time intervals), when the analog input signal originating from the analog input 2 falls below the ramp signal, thus crosses the latter to the bottom, with respect to the start signal, which is received from the start signal input 3.

The first 7 and the second TDC 8 in each case output their measuring results (outputs) to a histogram block 10.

This measuring process runs until the ramp counter 5 reaches a specified value and until the time-correlated measuring result, which is present in the histogram block 10, can be evaluated in the histogram block 10.

The ramp counter 5 also outputs a digital counter value (corresponds to a scanning cycle counter value), which corresponds to the ramp threshold value, to the histogram block 10, wherein the ramp threshold value is initially low and rises in the process.

At the beginning of each measuring cycle, all histogram values are initiated with a "O" in the histogram block 10.

The time intervals, at which the analog input signal is above the ramp signal, are stored in the histogram of the histogram block, wherein all measurements with a different ramp voltage are oriented on the point in time "O", which is determined by the start signal. The analog input signals can thereby have between O and N time intervals in each scanning cycle if it exceeds the ramp signal.

Every time the analog input signal exceeds the ramp signal in a scanning cycle, the corresponding region of bins of the histogram is filled with the current counter value of the ramp counter 5, wherein smaller values are overwritten with larger values in consecutive cycles, when the analog input signal is above the ramp signal.

As mentioned, the ramp generation is ended when the ramp counter 5 reaches the maximum value, and the data in the histogram of the histogram block 10 is ready for the evaluation, wherein a corresponding waveform output 11 can take place after the evaluation.

The measuring cycle is restarted in that the ramp counter 5 is reset and the histogram of the histogram block 10 is filled with "O" values.

Such a measuring cycle, which can take place by means of the AD converter 1, will now also be described with reference to FIG. 2, which shows an output 20 of the TDC 7 of the AD converter 1 at the top, and a TC histogram (TC=time correlated) 21, as it is generated in the histogram block 10, on the bottom.

In the case of this exemplary embodiment, there are six ramp values, wherein the output 20 of the first TDC 7 has entries for the six ramp values on the ordinate, and displays the time on the abscissa. The scanning of the analog input signal by the first TDC 7 results in twelve entries for the output 20.

The TC histogram 21 shows the state after a complete measuring cycle. Here, there are also six values on the ordinate corresponding to the six different ramp values, and the bins are arranged on the abscissa according to the time that has passed since the start "O".

The bins of the TC histogram 21 are filled with the value of the ramp signal every time the analog input signal is above the ramp signal, whereas the bins remain untouched at the time, at which the analog input signal is below the ramp signal. The course of the TC histogram 21 thereby corresponds roughly to a sine or Gauss curve.

As will be described below with reference to FIG. 3, the sequential scanning can react in a sensitive manner to time jittering, and in the case of some exemplary embodiments, the histogram block 10 of the AC converter 1 is configured according to FIG. 1, so that the time jitter performance is improved.

The time jitter effect is shown in FIG. 3, which shows an output 25 of the first TDC 7 on the top, and the resulting TC histogram 26, as it is created in the histogram block 10 under the influence of an (uncorrected) time jittering, on the bottom.

A negative scanning time jittering occurs for a scanning value "3" of the output 25, as shown in the case of reference numeral 25a, which results in that the scanning value "3" is scanned too early in terms of time at 25a, and the beginning and the end of the corresponding TDC output signals are thus shifted to the left by one time instance (earlier).

A positive scanning time jittering occurs for a scanning value "4" of the output 25, as shown in the case of reference numeral 25b, which results in that the scanning value "4" is scanned too late in terms of time at 25b, and the beginning and the end of the corresponding TDC output signals are thus shifted to the right by one time instance (later).

By proceeding in such a way that the maximum values are entered into the TC histogram 26 at the end, the value 26a in the third bin is increased from the value "1" (see FIG. 2, the third bin has the value "1" there) to the value "3", whereas the value 26b in the fifth bin is lowered from the value "4" (FIG. 2) to the value 2, and the value 26c of the third-to-last bin is increased from the value "1" (FIG. 2) to the value "4".

When comparing the course of the TC histogram 21 of FIG. 2 to the course of the TC histogram 26 of FIG. 3, it becomes apparent that the TC histogram 26 is less similar to a sine pattern than the TC histogram 21 of FIG. 2 due to the time jittering.

An exemplary embodiment is described below with reference to FIG. 4, in the case of which the sensitivity with regard to the time jittering is improved by means of the following measures, which can be provided by the histogram block 10 of the AD converter 1.

It will be assumed that a scanning of a time instance T is performed at a level N (ramp threshold value), a new value in the TC histogram (memory) at the time instance T is then equal to Fh(T,N).

The following rule (1) is now provided:
If (it) the previous histogram value is Fh(T,N-1)=N-1, then Fh(T,N)=N, or else (else) Fh(T,N)=combination (Fh(T,N-1),N).

It further applied for the method, which was described with reference to FIG. 2, that the values were combined maximally, that is, combination(A,B)=B, in other words, the bin value was always set to the largest value, which can therefore be susceptible to the time jittering.

In contrast, in the case of the present exemplary embodiment, a rule (2) applies, namely combination(A,B)=(A+B)/2, that is, the new value corresponds to the average value from the values A and B, which is also referred to as "50% combination method".

In the case of other exemplary embodiments, combination (A,B)=truncated ((A+B)/2) is provided in the alternative, which corresponds to a shift by one bin to the right, wherein the fraction is neglected.

It can further also be provided as alternative exemplary embodiment that a non-linear imaging function is used, which depends on the difference between B-A, and that, based thereon, the histogram values are corrected accordingly in order to reduce the effect of the time jittering.

On the top, FIG. 4 once again shows the output 25 of the first TDC 7 afflicted with a corresponding time jittering, as it was already described in connection with FIG. 3.

Figure 4:
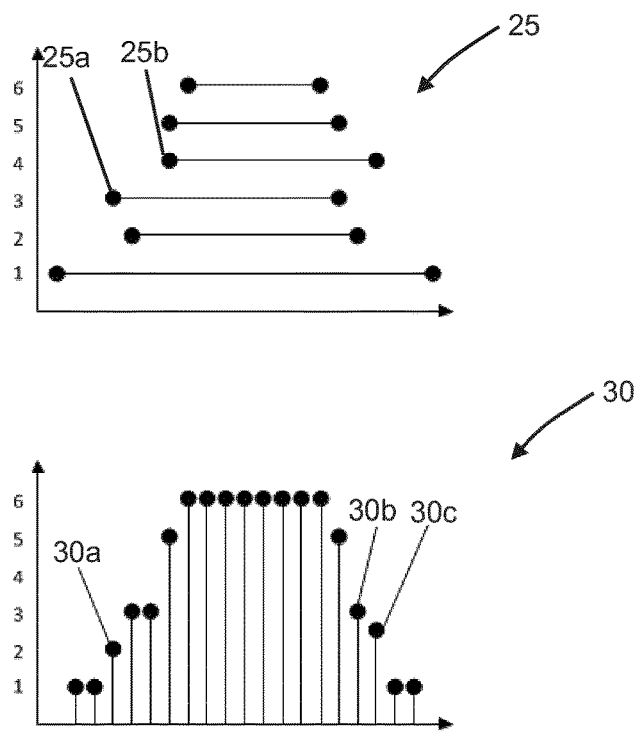
FIG. 4 shows an output of a TDC and a TC histogram under the influence of time jittering, wherein the TC histogram is corrected.

FIG. 4, bottom, shows the resulting TC histogram 30, which is generated by applying the above-mentioned measures, namely rules (1) and (2), wherein the effect of the time jittering is reduced here, compared to the TC histogram 26 of FIG. 3.

The scanning value at 30a (see value at 26a in FIG. 3) is reduced from the value "3" (26a in FIG. 3) to the value "2" (30a in FIG. 4) ("1" is original).

The scanning value, which corresponds to the value at 26b in FIG. 2, remains at the value "3", is thus not changed ("4" is original).

The scanning value at 30b is reduced from "4" to "3" ("4" is original).

The scanning value at 30c is reduced from "3.5" (see 26c in FIG. 3) to "2.5" ("1" is original).

Figure 5:
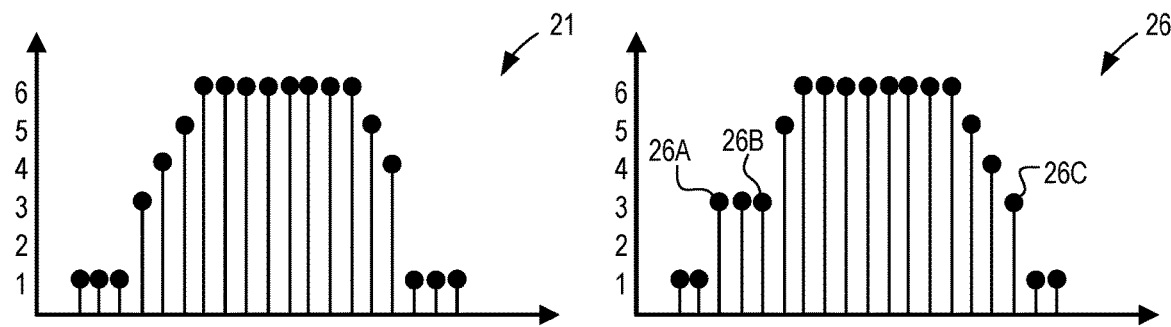
FIG. 5 shows TC histograms with (middle) and without (left) influence of time jittering and shows a corrected TC histogram (right)
Figure 5:
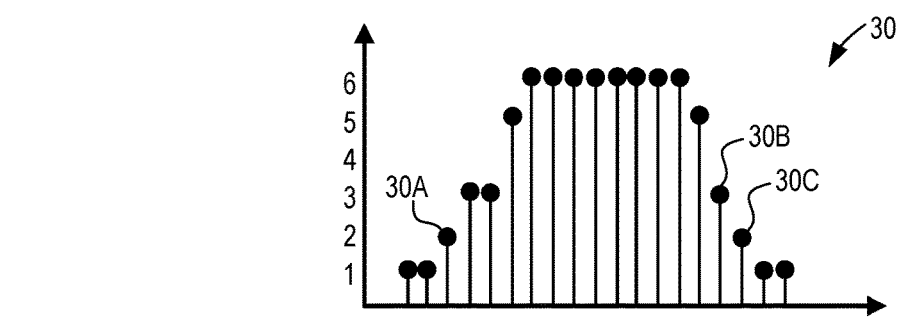

FIG. 5 now shows the result of the application of rules (1) and (2) (on the far right, TC histogram 30) compared to the normal (maximum) combination method (middle, TC histogram 26) when time littering it at hand, and without time jittering (TC histogram 21) on the far left.

It can be gathered from FIG. 5 that the proposed "50% combination method" (rule (2)) generates a TC histogram 30, which comes closer to the original course of the TC histogram 21 without time littering than the application of the described combination method, in the case of which simply the maximum value is assumed, and which generates the TC histogram 26 illustrated in the middle of FIG. 5 in response to time littering.

The maximum combination method illustrated in the middle of FIG. 5 tends to widen the form of the course of the histogram, and to generate larger steps in the case of the values between the individual bins, because it represents the time littering as well as the form of the signal.

The 50% combination method tends to increase the rise and fall time according to the time jitter statistics.

Figure 6:
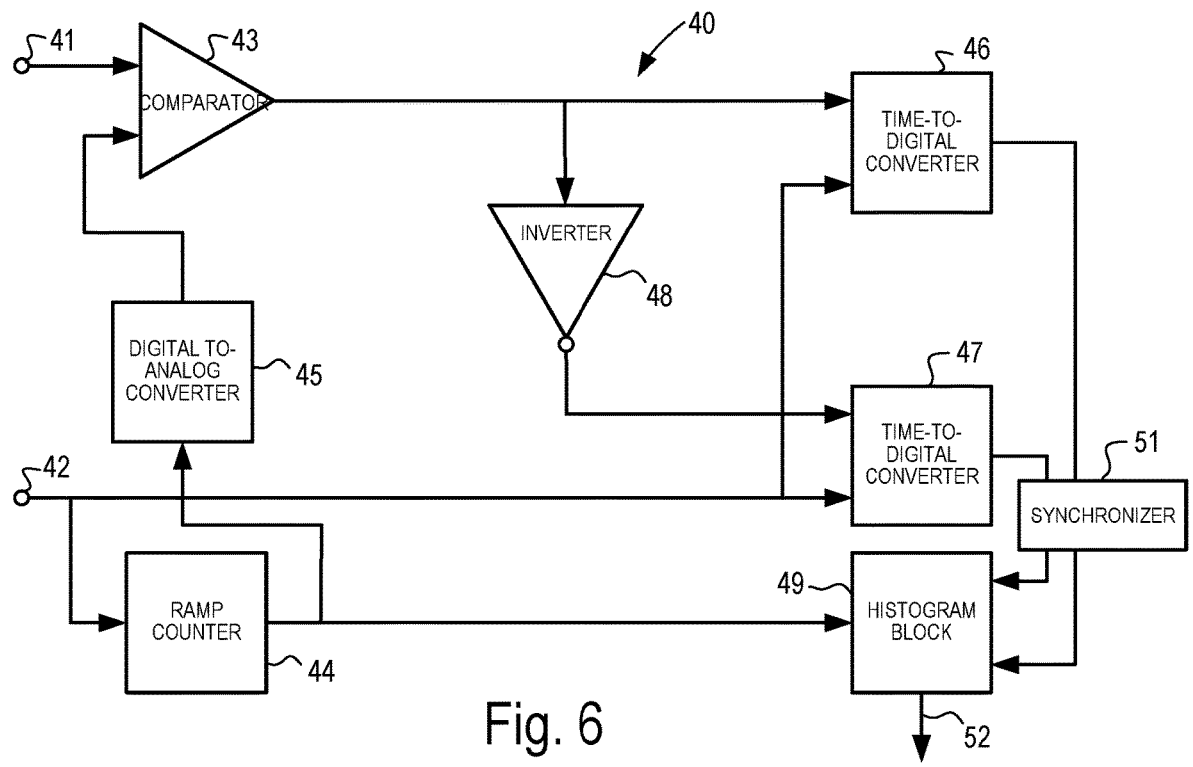
FIG. 6 shows a circuit diagram of an exemplary embodiment of an analog-to-digital converter with a pre-activation signal.

FIG. 6 shows a circuit diagram of a further exemplary embodiment of an analog-to-digital converter 40, hereinafter referred to as AD converter 40 in short.

As also specified above, the AD converter 40 can generally be used in the case of all signals, which are periodic and which repeat at least twice, without being changed, and it essentially corresponds to the AD converter 1, which was described in detail above.

In some exemplary embodiments, it is important to scan the rising signal flank of the input signal. In a LIDAR measuring system, it is important, for example, to scan the leading signal flank of the optical laser.

In the case of this exemplary embodiment, a pre-activation signal is thus provided, in order to initiate the AD conversion before the analog (input) signal is converted. This pre-activation signal is transmitted, for example, 3 ns before the start signal, without limiting the present invention to this example.

The AD converter 40 has an analog input 41, at which the analog signal to be converted is input, and it has a start signal input 51, to which a periodic start signal or pulse signal, respectively, is applied, which originates, for example, from a pulse generator and which is also used for the generation of light pulses for the LIDAR measuring system.

The AD converter 40 further has a pre-activation signal input 42, to which a pre-activation signal is applied, which, as mentioned, is transmitted, for example, 3 ns before the start signal.

The AD converter 40 further has a comparator 43 for comparing the analog signal, which is received at the analog input 41, to an analog ramp signal.

In this exemplary embodiment, the analog ramp signal has the shape of a rising sawtooth, starts at approximately zero volt, and rises up to a specified maximum value. The rise duration of the ramp signal is based here on a fixed multiple of the pulse generator frequency and is, for example, tramp=1/128*fpulse, in order to scan with an effective resolution of 7 bits, wherein "tramp" is the frequency of the ramp signal, and "fpulse" is the frequency of the pulse signal, which is received via the pre-activation signal input 42.

The ramp signal is generated via a ramp counter 44, which is coupled to a digital-to-analog converter 45 (hereinafter referred to as DA converter).

The ramp counter 44 increases its counter by one with each received pre-activation signals, which is received via the pre-activation signal input 42. The received binary value is delivered to the DA converter 45, which generates a corresponding ramp signal from the binary value, which thus also has a higher ramp voltage or a higher ramp threshold value, respectively, with increasing binary value.

On the one hand, the output of the comparator 43 is coupled (directly) to a first TDC 46 and, on the other hand, (indirectly) to a second TDC 47, wherein the comparator signal first runs through an inverter 48, which inverts the comparator signal and then delivers it to the second TDC 47.

The pre-activation signal is likewise delivered from the pre-activation signal input 42 to the first TDC 46 and to the second TDC 47, so that the pre-activation signal initiates a scanning.

The first TDC 46 measures the time instances (or time intervals), when the analog input signal originating from the analog input 41 rises beyond the ramp signal, thus crosses the latter to the top, with respect to the pre-activation signal, which is received from the pre-activation signal input.

The second TDC 47 receives the inverted comparator signal and measures the time instances (or time intervals), when the analog input signal originating from the analog input 41 falls below the ramp signal, thus crosses the latter to the bottom, with respect to the pre-activation signal, which is received from the pre-activation signal input 42.

The first 46 and the second TDC 47 in each case output their measuring results (outputs) to a synchronizer 50, which synchronizes the outputs of the TDCs 46 and 47 with the start signal 51.

The synchronizer 50 determines the time lag between the pre-activation signal and the start signal for each measuring cycle by means of t_diff(SC)=t_Start−t_pre-activation, wherein t_diff(SC) is the time lag between start signal and pre-activation signal, measured at the synchronizer 50, t_Start is the point in time of the start signal, and t_pre-activation is the point in time of the pre-activation signal.

The points in time t_Start and t_pre-activation are determined by means of the time t_nominal, which is at least as large as the maximally measured time lag of the start signal and of the pre-activation signal, i.e. t_nominal≥max(t_diff (SC)). The value t nominal is stored in the histogram block 49 as constant time value in each measuring cycle.

The synchronizer 50 synchronizes the measuring values of each measuring cycle, in that a constant time value t_offset(SC)=t nominal−t_diff(SC) is added to the outputs of the TDCs 46 and 47.

This measuring process continues, until the ramp counter 44 reaches a specified value, and the time-correlated measuring result, which is present in the histogram block 49, can be evaluated in the histogram block 49.

The ramp counter 44 also outputs a digital counter value, which corresponds to the ramp threshold value, to the histogram block 49, wherein the ramp threshold value is initially low and rises in the process.

At the beginning of each measuring cycle, all histogram values are initiated with a "O" in the histogram block 49.

The time intervals, at which the analog input signal is above the ramp signal, are stored in the histogram of the histogram block 49, wherein all measurements with a different ramp voltage are oriented on the point in time "O", which is determined by the pre-activation signal.

Every time the analog input signal exceeds the ramp signal, the corresponding region of bins of the histogram is filled with the current counter value of the ramp counter 5, wherein smaller values are overwritten with larger values in consecutive cycles, when the analog input signal is above the ramp signal.

When the ramp counter 44 reaches the maximum value, as mentioned, the ramp generation is ended, and the data in the histogram of the histogram block 49 is ready for the evaluations, wherein a corresponding waveform output 52 can take place after the evaluation.

The measuring cycle is restarted, in that the ramp counter 44 is reset, and the histogram of the histogram block 49 is filled with "O" values.

REFERENCE NUMERALS

1 analog-to-digital converter
2 analog input
3 start signal input
4 comparator
5 ramp counter
6 DA converter
7 first TDC
8 second TDC
9 inverter
10 histogram block
11 waveform output
20 output of the first TDC 7
21 TC histogram
25 output of the first TDC 7 with time jittering
26 TC histogram
30 TC histogram
40 analog-to-digital converter
41 analog input
42 pre-activation signal input
43 comparator
44 ramp counter
45 digital-to-analog converter 45
46 first TDC
47 second TDC
48 inverter
49 histogram block
50 synchronizer
51 start signal input
52 waveform output

The invention claimed is:

1. An analog-to-digital converter, comprising:
   an analog input for receiving an analog signal;
   a first time-to-digital converter, where the first time-to-digital converter determines a first time interval for which the analog signal is above a ramp signal;
   a second time-to-digital converter, where the second time-to-digital converter determines a second time interval for which the analog signal is below the ramp signal; and
   a histogram block, where the histogram block generates a time-correlated histogram of values corresponding to the first time interval and the second time interval.

2. The analog-to-digital converter according to claim 1, wherein the histogram block is configured to correct the time-correlated histogram, in order to reduce the effect of a time jittering.

3. The analog-to-digital converter according to claim 2, wherein the effect of the time jittering leads to time-shifted values in the output of the first time-to-digital converter.

4. The analog-to-digital converter according to claim 1, wherein the analog signal is received from a photodiode in a Light Detection and Ranging (LIDAR) device.

5. The analog-to-digital converter according to claim 1, wherein the histogram block generates the time-correlated histogram of values using a maximum value for each bin in the time-correlated histogram of values.

6. The analog-to-digital converter according to claim 1, wherein the histogram block generates the time-correlated histogram of values using an average value for each bin in the time-correlated histogram of values.

7. The analog-to-digital converter according to claim 1, wherein the histogram block generates the time-correlated histogram of values by combining values using a function for each bin in the time-correlated histogram of values.

8. The analog-to-digital converter according to claim 7, wherein the function is non-linear.

9. The analog-to-digital converter according to claim 8, wherein the function depends on the difference of the values.

10. The analog-to-digital converter according to claim 1, wherein the values in the time-correlated histogram of values are shifted by at least one time instance.

11. The analog-to-digital converter according to claim 1, further comprising a start signal input receiving a periodic start signal.

12. The analog-to-digital converter according to claim 11, further comprising a ramp counter, which generates a counter value based on the periodic start signal.

13. The analog-to-digital converter according to claim 12, further comprising a digital-to-analog converter, which generates the ramp signal based on the counter value.

14. The analog-to-digital converter according to claim 1, further comprising a comparator which compares the ramp signal and the analog signal, and outputs a comparator signal to the first time-to-digital converter.

15. An analog-to-digital converter, comprising:
an analog input for receiving an analog signal;
ramp counter, where the ramp counter generates counter values based on a periodic start signal;
a digital-to-analog converter, where the digital analog converter receives the counter values and generates a ramp signal based on the counter values;
a first time-to-digital converter, where the first time-to-digital converter determines a first time interval for which the analog signal is above the ramp signal;
a second time-to-digital converter, where the second time-to-digital converter determines a second time interval for which the analog signal is below the ramp signal; and
a histogram block, where the histogram block generates a time-correlated histogram of values corresponding to the first time interval and the second time interval, where the values in the time-correlated histogram of values are determined using the counter values.

16. An analog-to-digital converter, comprising:
an analog input for receiving an analog signal;
ramp counter, where the ramp counter generates counter values;
a first time-to-digital converter, where the first time-to-digital converter determines a first time interval for which the analog signal is above the ramp signal;
a second time-to-digital converter, where the second time-to-digital converter determines a second time interval for which the analog signal is below the ramp signal;
a histogram block, where the histogram block generates a time-correlated histogram of values corresponding to the first time interval and the second time interval, where the values are determined using the counter values.

17. The analog-to-digital converter according to claim 16, wherein the histogram block generates the time-correlated histogram of values using a maximum counter value for each bin in the time-correlated histogram of values.

18. The analog-to-digital converter according to claim 16, wherein the histogram block generates the time-correlated histogram of values using an average counter value for each bin in the time-correlated histogram of values.

19. The analog-to-digital converter according to claim 16, wherein the histogram block generates the time-correlated histogram of values using combined counter values for each bin in the time-correlated histogram of values, where the counter values are combined using a non-linear function.

20. The analog-to-digital converter according to claim 16, further comprising a digital-to-analog converter, where the digital analog converter receives the counter values and generates the ramp signal based on the counter values.

* * * * *